United States Patent [19]
Kressel et al.

[11] 4,070,206
[45] Jan. 24, 1978

[54] POLYCRYSTALLINE OR AMORPHOUS SEMICONDUCTOR PHOTOVOLTAIC DEVICE HAVING IMPROVED COLLECTION EFFICIENCY

[75] Inventors: Henry Kressel, Elizabeth; Robert Vincent D'Aiello, East Brunswick; Paul Harvey Robinson, Lawrenceville, all of N.J.

[73] Assignee: RCA Corporation, New York, N.Y.

[21] Appl. No.: 688,476

[22] Filed: May 20, 1976

[51] Int. Cl.² ............................................. H01L 31/06
[52] U.S. Cl. ........................... 136/89 TF; 136/89 PC; 136/89 CC; 136/89 SJ; 357/30; 29/572
[58] Field of Search .......... 136/89 SJ, 89 CC, 89 PC, 136/89 TF; 357/30

[56] References Cited
U.S. PATENT DOCUMENTS

| | | | |
|---|---|---|---|
| 2,001,672 | 5/1935 | Carpenter | 136/89 X |
| 3,175,929 | 3/1965 | Kleinman | 136/89 |
| 3,331,707 | 7/1967 | Werth | 136/89 |
| 3,359,137 | 12/1967 | Kaye et al. | 136/89 |
| 3,483,039 | 12/1967 | Gault | 136/89 |
| 3,682,708 | 8/1972 | Bennett | 136/89 |
| 3,990,101 | 11/1976 | Ettenberg et al. | 357/30 |
| 3,994,012 | 11/1976 | Warner, Jr. | 357/30 |

*Primary Examiner*—John H. Mack
*Assistant Examiner*—Aaron Weisstuch
*Attorney, Agent, or Firm*—H. Christoffersen; B. E. Morris; D. N. Calder

[57] ABSTRACT

A body of semiconductor material having a first surface and a second surface spaced from the first surface includes a first layer along the first surface, a second layer along the second surface, a third layer between and contiguous to the first and second layers. The third layer is of a conductivity type opposite that of the first and second layers so as to form first and second P-N junctions respectively therebetween. The thickness of the third layer is at least twice the minority carrier diffusion length of the semiconductor material, so that carriers generated within the third layer have a high probability of being collected by one of the P-N junctions. The body includes means for electrically connecting the first and second P-N junctions and means for transferring the carriers collected at the first P-N junction to a portion of the first surface.

11 Claims, 7 Drawing Figures

POLYCRYSTALLINE OR AMORPHOUS SEMICONDUCTOR PHOTOVOLTAIC DEVICE HAVING IMPROVED COLLECTION EFFICIENCY

This invention herein described was made in the performance of work under a NASA contract and is subject to the provisions of section 305 of the National Aeronautics and Space Act of 1958, Public Law 85-568 (72 Stat. 435; 42 U.S.C. 2457).

BACKGROUND OF THE INVENTION

The present invention relates to photovoltaic devices and more particularly to photovoltaic devices having improved carrier collection efficiency.

It is well known to those in the photovoltaic art that radiation at the higher wavelength portion of the solar spectrum must travel farther through a body of semiconductor material in order to be absorbed. The farther into the semiconductor body radiation must travel in order to be absorbed, the longer the carrier diffusion length should be to assure collection of the generated carriers at a P-N junction. Semiconductor materials which are of poor crystalline quality, e.g., polycrystalline and amorphous semiconductor materials, have diffusion lengths of generated carriers which are relatively short. Thus photovoltaic devices of a thickness sufficient to absorb the high wavelength portion of the solar spectrum could not be fabricated utilizing these semiconductor materials. These semiconductor materials are cheaper to fabricate than the higher quality semiconductor materials, e.g., single crystalline silicon. Thus, it would be most desirable to have a photovoltaic device, and especially a solar cell, which had an improved collection efficiency so that the poor quality semiconductor materials can be used more practically. Also, such a photovoltaic device would improve the effectiveness of higher quality semiconductor materials.

SUMMARY OF THE INVENTION

A photovoltaic device includes a body of semiconductor material capable of generating carriers by the absorption of solar radiation. The body has a first surface and a second surface opposite the first surface. The body includes a first layer of one conductivity type along the first surface, a second layer of the same conductivity type as the first layer along the second surface, and a third layer between and contiguous to both first and second layers. The third layer is of a conductivity type opposite the conductivity type of the first and second layers. There is a first P-N junction between the first and third layers and a second P-N junction between the second and third layers. The third layer has a thickness, from the first P-N junction to the second P-N junction, at least twice the minority carrier diffusion length of the semiconductor material of the body. The body also includes a means for transferring carriers collected at the first P-N junction to a portion of the first surface and a means for electrically connecting the first and second P-N junctions.

DETAILED DESCRIPTION OF THE INVENTION

Figure 1:
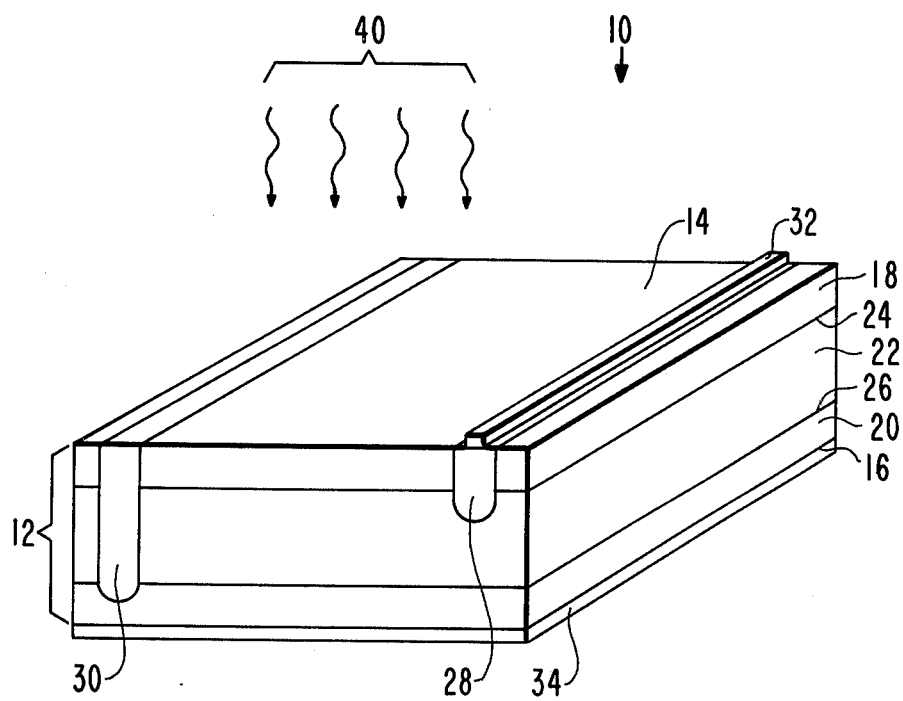
FIG. 1 is a perspective view of the first embodiment of the photovoltaic device of the present invention.

Referring to FIG. 1, the photovoltaic device of the present invention is designated as 10. For the purpose of describing the photovoltaic device 10 of the present invention, the device 10 will be described as a solar cell. The solar cell 10 includes a body 12 of semiconductor material capable of generating carriers by the absorption of solar radiation. The semiconductor material of the body 12 may be of a single crystalline semiconductor material, such as silicon, or it may be of a polycrystalline or amorphous semiconductor material, such as polycrystalline and amorphous silicon. The body 12 has two substantially flat and opposed surfaces consisting of a first surface 14, on which solar radiation is capable of impinging solar cell 10, and a second surface 16.

Along the first surface 14 is a first layer 18 of the body 12, and along the second surface 16 but spaced from the first layer 18 is a second layer 20. Both first and second layers 18 and 20 are of the same conductivity type. A third layer 22 is between and contiguous to both the first layer 18 and the second layer 20. The third layer 22 is of a conductivity type opposite that of the first and second layers 18 and 20. Thus, there is a first P-N junction 24 between the first layer 18 and third layer 22, and a second P-N junction 26 between the second layer 20 and third layer 22. For the purpose of explaining the solar cell 10 of the present invention, the first and second layers 18 and 20 are assumed to be of P type conductivity while the third layer 22 is assumed to be of N type conductivity, although the conductivities of the three layers, 18, 20 and 22 can be opposite that described.

The third region 22 between the first P-N junction 24 and second P-N junction 26 is of a thickness of at least two times the minority carrier diffusion length of the semiconductor material of the body 12. While it is preferable that the thickness of the third region 22 be two times the minority carrier diffusion length, the thickness of the third region may be larger than two times the minority carrier diffusion length, for reasons subsequently explained.

The body 12 includes means for transferring carriers which are collected at the first P-N junction 24 to a portion of the first surface 14. The carrier transfer means can be a first pocket region 28 which is at a portion of the first surface 14 and extends into the body 12 at least to the first P-N junction 24. Spaced from the first pocket region 28 is means for electrically connecting the first and second P-N junctions 24 and 26. The connecting means can be a second pocket region 30 which is at a portion of the first surface 14 and extends into the body 12 crossing the first P-N junction 24 and continuing to at least the second P-N junction 26. The first pocket region 28 is of the same conductivity type as the third layer 22 but is of a higher dopant concentration. The second pocket region 30 is of the same conductivity type as the first and second layers 18 and 20 but of a higher dopant concentration.

A first electrode 32 is in contact with the first pocket region 28 at the first surface 14. On the second surface 16 and in contact with the second layer 20 is a second electrode 34. Both first and second electrodes 32 and 34 form ohmic contacts with the semiconductor body 12. The first and second electrodes may be of a single layer of a metal, such as aluminum, or they may be of multilayers, such as a first layer of chromium directly on the body 12 and a second layer of gold on the chromium layer.

In the operation of the solar cell device 10, solar radiation 40 first encounters the cell 10 at the first surface 14. Solar radiation penetrating into the body 12 will be absorbed by the body 12 resulting in the generation of electron-hole pairs. The lower wavelength portion of the solar spectrum contains photons of higher energy than the higher wavelength portion of the solar spectrum. Consequently, the lower wavelength radiation is absorbed close to the first surface 14 in the first region 18. The higher wavelength portion of the solar spectrum must travel deeper into the body 12 before it will be absorbed, typically in the third and second layers 22 and 20.

As stated previously, the third layer 22 is preferably of a thickness of about twice the minority carrier diffusion length of the semiconductor material of body 12. As a consequence of the layer 22 being of such a thickness more radiation will be absorbed in the third layer 22 then if it were only of a thickness of a minority carrier diffusion length. The carriers generated within the third layer 22 have a very high probability of being collected since they are generated at a distance no farther than a minority carrier diffusion length from either the first or second P-N junctions 24 and 26. Therefore, the cell 10 has an increased carrier collection efficiency.

The thickness of the third layer 22 can be larger than twice the minority carrier diffusion length resulting in the absorption of more radiation, but the probability of collecting carriers which are generated farther than a minority carrier diffusion length from either P-N junctions 24 or 26 begins to be reduced. In addition, the increased thickness of the third layer 22 will add to the series resistance of the cell 10. Nevertheless, a trade-off between increasing layer 22's thickness beyond twice the minority carrier diffusion length and reducing collection efficiency may be made by one skilled in the art to optimize cell efficiency. Factors which one may consider in such an optimization include what semiconductor material is being used and what portion of the solar spectrum is to be utilized to its fullest extent. Since the solar cell 10 of the present invention provides increased carrier collection efficiency for a third layer 22 which is relatively thick, i.e., at least twice the minority diffusion length, the cell 10 may be of semiconductor materials which have shorter diffusion lengths than single crystalline materials. Semiconductor materials having a low diffusion length are, for example, polycrystalline and amorphous crystalline semiconductor materials.

Figure 2:
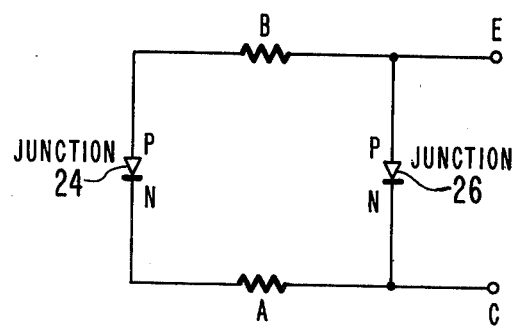
FIG. 2 is a schematic diagram of the equivalent electrical circuit of the photovoltaic device of FIG. 1.

The function of the first pocket region 28 is to transfer the carriers collected at the second P-N junction 26 to the first surface 14 and first electrode 32, while the function of the second pocket region 30 is to electrically connect the first and second P-N junctions 24 and 26. Referring to FIG. 2, the solar cell device 10 is in essence electrically equivalent to two solar cells connected in parallel with each other. In FIG. 2 the first and second P-N junctions 24 and 26 are represented by the electrical symbol for a diode while the third region 22, common to both solar cells, is represented by the resistor A and the second pocket region 30 is represented by the resistor B. The cell 10 makes electrical contact to external circuitry at the first electrode 32, represented by point C, and second electrode 34, represented by point E.

In the fabrication of the cell 10, vapor or liquid phase epitaxy processes well known in the art may be utilized to sequentially grow the third layer 22 and first layer 18 on a substrate which will become second layer 20. If fabricated by vapor epitaxy methods, where the semiconductor material to be grown is single crystalline silicon, a P type conductivity silicon substrate is placed in the vapor phase deposition chamber. A source gas such as silane or silicon tetrachloride or dichlorosilane is bled into the vapor deposition chamber along with appropriate doping gases to first form the third layer 22 on the substrate and then the first layer 18 on the third layer 22. Typically, the first layer 18 will have a P type doping concentration on the order of or greater than $10^{18}$ atoms/cm$^3$ and be of a thickness less than or equal to about 1 micron. The third layer 22 has an N type doping concentration on the order of $10^{14}$ to $10^{17}$ atoms/cm$^3$. As previously stated the thickness of the third region 22 is typically on the order of twice the minority carrier diffusion length of the semiconductor material. Thus depending on whether the semiconductor material is single crystalline or polycrystalline or amorphous, the thickness of the third layer 22 can range from as high as the order of 100 microns to as low as an order of 5 microns in thickness.

After the third and first layers 22 and 18 have been formed, the P type substrate, which may be as thick as 10 mils, is either lapped or ground to a thickness on the order of a couple of mils, thereby forming the second layer 20. If the second layer 20 were more than a couple of mils thick it would add to the series resistance of the cell 10.

Alternatively, the second, third and first layers 20, 22 and 18 can be formed by sequentially depositing the layers on a heavily doped N+ substrate of silicon. Then by using a preferential etch the N+ substrate is removed.

After forming the second, third and first layers 20, 22 and 18, an oxide layer, such as silicon dioxide, is deposited by well known evaporation techniques or grown by oxidation techniques on the first surface 14. By photolithographic and etching techniques a gap is formed into the oxide layer at the first surface 14 where the second pocket region 30 is to be formed. The body 12 with the patterned oxide layer is then placed in a diffusion furnace and a P type dopant, such as boron or aluminum, is diffused into the body 12, crossing the first P-N junction 24 and continuing to at least the second P-N junction 26, thereby forming second pocket region 30. Typically, the conductivity concentration of the second pocket region will be on the order of $10^{20}$ atoms/cm$^3$. The patterned oxide layer is then removed by standard stripping techniques such as by etching with buffered HF. Then another patterned oxide mask is formed like the first patterned oxide mask on the first surface 14, but with a gap in the oxide layer where the first pocket region 28 is to be formed. Again the wafer is placed into a diffusion furnace; this time an N type dopant, such as phosphorous or arsenic, is diffused into the body 12 to at least the first P-N junction 24, thereby forming the first pocket region 28. Typically the first pocket region 28 will be of a dopant concentration on the order of $10^{20}$ atoms/cm$^3$. It is preferable to first form the second pocket region 30 before forming the first pocket region 28. As is well known in the art, dopants diffuse less rapidly with time, thus, while the first pocket region 28 is being formed the second pocket region 30 which has already been formed will diffuse little more.

Next, the body 12 is placed in an evaporation furnace, where by standard evaporation techniques well known in the art, the second electrode 34 of a metal, such as aluminum, is deposited on the second surface 16. A metallic layer is then deposited on the first surface 14 and by well known photolithographic and etching techniques the pattern of the first electrode 32 is defined on the metal layer and the unwanted portion of the metal layer is etched away forming first electrode 32, and thereby completing the fabrication of the photovoltaic device 10.

Figure 3:
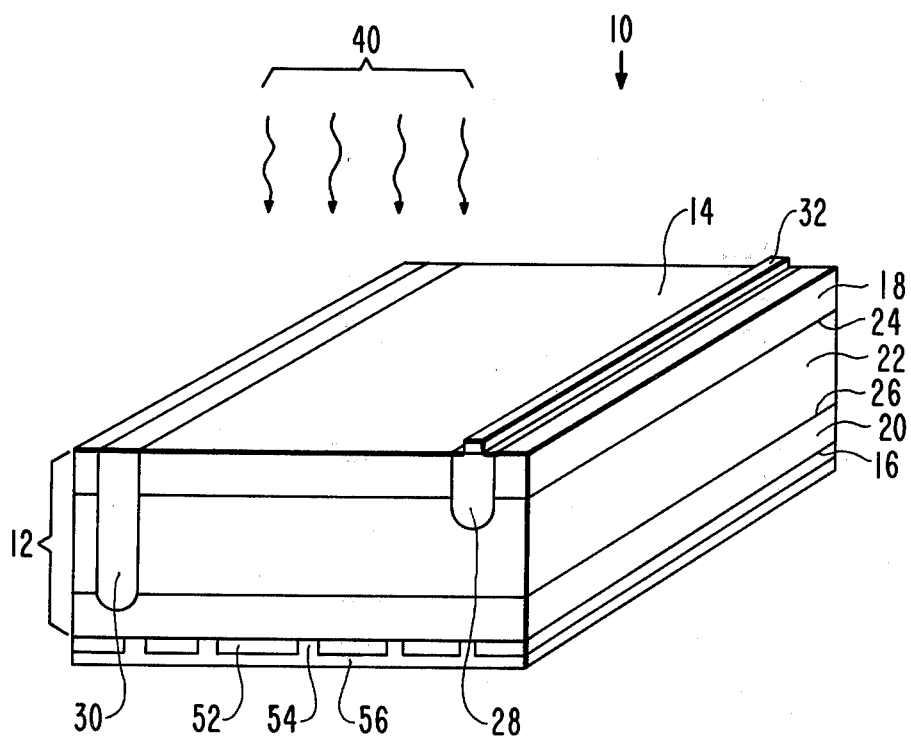
FIG. 3 is a perspective view of the first embodiment of the present invention, as shown in FIG. 1, with means for both electrically contacting the device and reflecting unabsorbed solar radiation back into the device.

Referring to FIG. 3, it is anticipated by the present invention that means for both electrically contacting second layer 20 and reflecting unabsorbed solar radiation back into the body 12 may be on the second surface 16. The means will increase the radiation absorption of body 12. Means for both electrically contacting and radiation reflecting are well known in the art. By way of example, the means may include a non-continuous oxide layer 52 having openings 54 therethrough to the second surface 16. The openings 54 can be in any form well known to those in the art such as grid pattern. In the openings 54 and on the oxide layer 52 is a layer 56 of a material which is reflective to solar radiation, such as metal.

Figure 4:
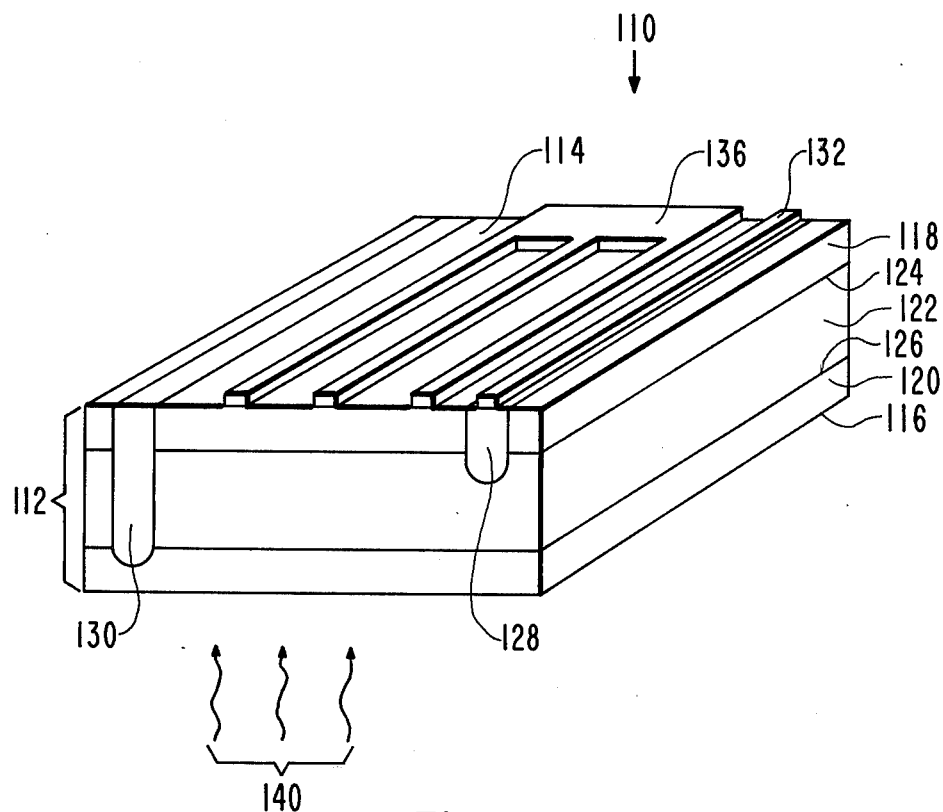
FIG. 4 is a perspective view of the second embodiment of the photovoltaic device of the present invention.

Referring to FIG. 4, a second embodiment of the photovoltaic device of the present invention is designated as 110. For the purpose of explaining the photovoltaic device 110 it will be described as a solar cell. The solar cell 110 is very similar in structure to that of the solar cell 10 of the first embodiment except that the solar cell 110 does not have a second electrode 34 on the second surface 16. Instead solar cell device 110 has a grid electrode 136 on the first surface 1/4 between the first and second pocket regions 128 and 130 at the first surface 114. The grid electrode 136 can be in any grid shape well known to those in the solar cell art such as the finger type shown in FIG. 4, but it should only cover a small portion of the first surface 114, i.e., cover less than about 5% of the area of the first surface 114. If the electrode 136 is only on a small portion of first surface 114 it can prevent only a small portion of the solar radiation from impinging on first surface 114. The grid electrode 136 can be of a single layer of a metal, such as aluminum or it can be of multi-layer, such as a first layer of chromium directly on the first surface 114 with a layer of gold on the chromium layer.

Figure 5:
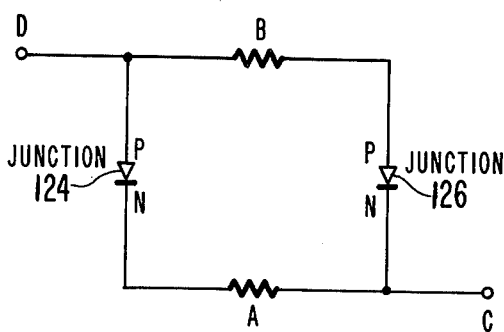
FIG. 5 is a schematic diagram of the equivalent electrical circuit of the photovoltaic device of FIG. 4.

The operation of the solar cell 110 is similar to that of the solar cell 10 of the first embodiment. Like the first embodiment, the cell 110 is electrically equivalent to two solar cells in parallel as shown in FIG. 5. The only difference between the schematics shown in FIG. 5 for the second embodiment and that shown in FIG. 2 for the first embodiment is that electrical contact to external circuitry is made at the first electrode 132, represented by point C, and at the grid electrode 136, represented by point D, for the second embodiment.

Because the contacts are only on a portion of one surface of the solar cell 110 the second embodiment of the present invention has an advantage over the first embodiment in that solar radiation can impinge either surface. Also, now that solar radiation can impinge either surface, a reflector can be at the second surface 116 without the interference of a contact on the second surface 116. This advantage of the second embodiment can be used in several applications. In a first application, as shown in FIG. 4, solar radiation 140 can directly impinge the second surface 116 without any interference from the electrodes.

Figure 6:
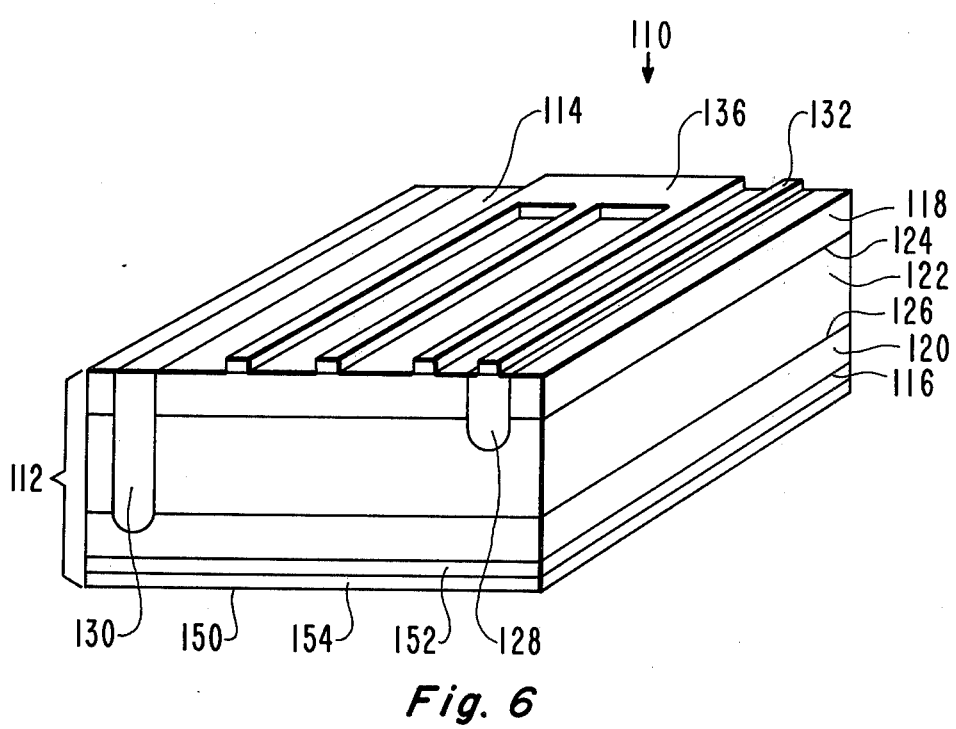
FIG. 6 is a perspective view of the second embodiment of the photovoltaic device of the present invention, as shown in FIG. 4, with a radiation reflecting means on a surface of the device.

In a second application, referring to FIG. 6, a means for reflecting radiation 150 is on the second surface 116 so that solar radiation which initially impinged the first surface 114 and passed through the body 112 may be reflected back into the body 112 by the reflector 150 for further absorption. The radiation reflecting means 150 can be an oxide layer 152 directly on the second surface 116 with a layer 154 which is reflective to solar radiation on the oxide layer 152. The oxide layer may be, for example, silicon dioxide and the layer 154 may be a metal. The reflecting means 150 shown in FIG. 6 is only by way of an example, since other reflecting means well known to those in the art could also be utilized.

Figure 7:
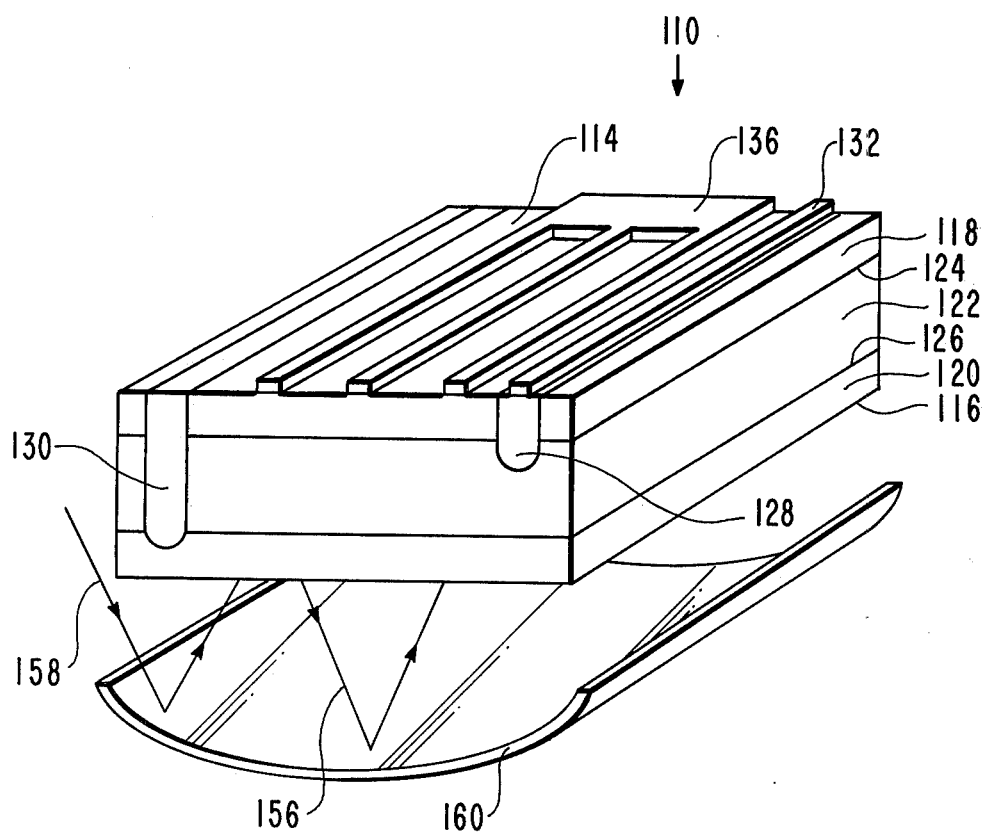
FIG. 7 is a perspective view of the second embodiment of the photovoltaic device of the present invention, as shown in FIG. 4, with a radiation reflecting means spaced from the surface of the device.

Thirdly, a radiation reflecting means 160 such as the parabolic mirror in FIG. 7, is spaced from the second surfce 116 so that both filtered solar radiation 156, i.e., solar radiation which has traveled through the body 112 after first impinging the first surface 114, and unfiltered solar radiation 158, i.e., solar radiation which has never entered the body 112, may be directed toward the second surface 116. The parabolic mirror is only shown as an example since other spaced reflecting means 160 well known to those in the art can also be utilized.

In the instances where unfiltered solar radiation first impinges the second surface 116 the thickness of the second layer 120 should typically be less than a minority carrier diffusion length of the semiconductor material of the body 112. The reason for this requirement in thickness is that the unfiltered solar radiation consists of high energy photons, i.e., the lower wavelength portion of the solar spectrum, which are absorbed quite readily by the semiconductor material within a short distance. Therefore to assure that these carriers will be able to diffuse to the second P-N junction 126, it is preferable that the thickness of the second layer 120 be less than a minority carrier diffusion length. In contrast, when the only solar radiation striking the second surface 116 is solar radiation which has been filtered through the body 112 and is just being reflected back into the body 112, the thickness of the second layer 120, in these circumstances, should be on the order of at least twice the minority carrier diffusion length. The reason for the first layer 118 being thicker in this instance is because the filtered solar radiation contains photons of low energy levels which will have to travel farther through the semiconductor material before they are absorbed.

The fabrication of the second embodiment of the present invention is substantially the same as that of the first embodiment. The difference in fabrication is that both first electrode 132 and grid electrode 136 can be formed on the incident surface 114 at the same time. In forming the first electrode 132 and grid electrode 136 a metallic layer is first deposited on the first surface 114. Then by photolithographic techniques well known in the art the pattern of the electrode 132 and the electrode 136 are defined on the metallic layer and then by etching techniques well known in the art the unwanted portion of the metallic layer is removed thereby forming the first electrode 132 and grid electrode 136.

The first and second embodiments of the photovoltaic device of the present invention provides higher collection efficiency of carriers formed in the semiconductor body of the device. This makes possible the utilization in photovoltaic devices semiconductor materials having a short diffusion length and improves the carrier collection efficiency of photovoltaic devices using semiconductor materials of longer diffusion lengths.

We claim:

1. A photovoltaic device comprising:
   a body of polycrystalline or amorphous semiconductor material capable of generating carriers by the absorption of solar radiation having first and second opposed surfaces and including therein a first layer of one conductivity type along the first surface, a second layer of the same conductivity type as said first layer along the second surface and a third layer between and contiguous to both first and second layers, said third layer being of a conductivity type opposite the conductivity type of said first and second layers so as to form a first P-N junction between said first and third layers and a second P-N junction between said second and third layers, said third layer being of a thickness, from said first P-N junction to said second P-N junction, of at least about twice the minority carrier diffusion length of the semiconductor material of said body;
   a first pocket region at said first surface and extending as far as the first P-N junction, said first pocket region being of the same conductivity type as said third layer but of a higher concentration;
   means for electrically connecting the first and second P-N junctions; and
   means for both electrically contacting said second layer at said second surface and reflecting solar radiation unabsorbed by said body back into said body.

2. The photovoltaic device in accordance with claim 1 wherein said electrically connecting means is a second pocket region at said first surface crossing the first P-N junction and extending to the second P-N junction, said second pocket region being of the same conductivity type as the first and second layers but of a higher concentration.

3. The photovoltaic device in accordance with claim 2 further comprising a first electrode on said first pocket region at the first surface, having an ohmic contact with said pocket region.

4. The photovoltaic device in accordance with claim 3 further comprising a second electrode along the second surface having an ohmic contact with said second layer.

5. The photovoltaic device in accordance with claim 4 wherein the thickness of said third layer is about twice the minority carrier diffusion length of the semiconductor material of said body.

6. The photovoltaic device in accordance with claim 2 further comprising:
   a first electrode on said first pocket region at the first surface, having an ohmic contact with said first pocket region; and
   a grid electrode on a portion of the first surface spaced between said first and second pocket regions at the first surface, having an ohmic contact with said first layer.

7. The photovoltaic device in accordance with claim 6 wherein said grid electrode is on 5% or less of the surface area of the first surface between said first and second pocket regions at the first surface.

8. The photovoltaic device in accordance with claim 7 wherein said grid electrode is finger shaped.

9. The photovoltaic device in accordance with claim 6 further comprising solar radiation reflecting means on the second surface.

10. The photovoltaic device in accordance with claim 9 wherein the thickness of said second layer is on the order of at least twice the minority carrier diffusion length of the semiconductor material of said body.

11. The photovoltaic device in accordance with claim 6 further comprising solar reflecting means spaced from said second surface.

* * * * *